United States Patent [19]
Wada et al.

[11] Patent Number: 5,045,638
[45] Date of Patent: Sep. 3, 1991

[54] APPARATUS FOR SHIELDING ELECTROMAGNETIC RADIATION

[75] Inventors: Hideaki Wada; Naoto Kitahara; Masami Koshimura; Mikiya Ono, all of Saitama, Japan

[73] Assignee: Mitsubishi Mining & Cement Co., Ltd., Tokyo, Japan

[21] Appl. No.: 353,773

[22] Filed: May 18, 1989

[30] Foreign Application Priority Data

May 18, 1988 [JP] Japan ................................ 63-122660

[51] Int. Cl.[5] ................................................ H05K 9/00
[52] U.S. Cl. ............................ 174/35 R; 219/10.55 D
[58] Field of Search .................. 174/35 MS, 35 R, 36; 361/424; 264/104; 219/10.55 D, 10.55 R

[56] References Cited

U.S. PATENT DOCUMENTS 4,046,983 9/1977 Ishino et al. ................. 219/10.55 D
4,539,433 9/1985 Ishino et al. .................. 174/35 MS
4,699,743 10/1987 Nakamura et al. ................ 264/104
4,814,546 3/1989 Whitney et al. ..................... 174/36

*Primary Examiner*—Leo P. Picard
*Assistant Examiner*—Bot L. Ledynh
*Attorney, Agent, or Firm*—Cushman, Darby & Cushman

[57] ABSTRACT

This invention relates to an apparatus for shielding electromagnetic radiation which includes a casing made primarily of electromagnetic shielding material and an electromagnetic wave suppressor member having high permeability and/or permittivity. A method for using this apparatus also is described. The suppressor member has a high dielectric loss and/or high magnetic loss at a location close to the place in the casing where electromagnetic waves are less shielded, thereby reducing leakage of undesirable electromagnetic waves from the casing.

10 Claims, 3 Drawing Sheets

APPARATUS FOR SHIELDING ELECTROMAGNETIC RADIATION

BACKGROUND OF THE INVENTION

This invention relates to a shielding apparatus which will reduce leakage of undesirably generated electromagnetic waves, and which provides insulation from the influence of external noise. More particularly, this invention relates to an insulating box or casing of an electronic device.

Recent advances in electronics technology have led to an increase in the use of computers and other digital electronic devices. In turn, this has led to problems resulting from electromagnetic interference, primarily caused by the leakage of electromagnetic waves from electronic devices.

In order to prevent electromagnetic interference, it is necessary to fully cover a device which emits electromagnetic radiation with a casing which is made of a shielding material and is joined without seams. Metal plates are conventionally used as a suitable material, but are detrimental in that they may be difficult to shape into a specified form. In practice, moreover, it is preferable that a casing can easily be detached for maintenance purposes. Furthermore, using conventional methods, the emission of electromagnetic radiation from certain parts of a device, for example switches, connectors, air vents and display screens, cannot be fully shielded.

When a device is to be enclosed within a molded plastic casing, the type of casing known in the prior art provides for plating the device with metal on an internal surface of the casing, or otherwise applying a suitable coating for effective electromagnetic shielding. This type of electromagnetic shielding may be insufficient.

It is difficult to treat a display screen for electromagnetic shielding using conventional techniques, and therefore the leakage of electromagnetic waves often cannot be reduced below a certain level. However, as the number of electronic devices increases, the allowable leakage per device inevitably becomes restricted.

This invention aims to solve these problems encountered in the prior art, and to provide a casing suitable for use on an electronic device which can significantly reduce leakage of electromagnetic waves. Thus, the invention may be used to substantially reduce electromagnetic interference which may otherwise cause problems in the area surrounding an electromagnetic device.

SUMMARY OF THE INVENTION

In order to achieve the aforementioned objects, this invention provides an apparatus for shielding electromagnetic radiation including a casing comprised of electromagnetic shielding material and an electromagnetic wave suppressor member made of a material which has high magnetic permeability and/or high permittivity at high frequencies and yet has a significant electromagnetic and/or dielectric loss.

The shielding material can be made of any suitable material, for example materials known in the art, such as tin plate. The suppressor member may be made of any suitable material having high permeability and/or high permittivity and having electromagnetic and/or dielectric loss, and as a non-limiting example, may be made of ferrite and/or a ferroelectric substance having a perovskite structure. The suppressor member preferably is comprised of particles and is sintered.

If ferrite particles are used, they are of a size such that there is satisfactory magnetic coupling between the particles. If dielectric particles are used, they are of a size such that their dielectric properties are maintained. If a mixture of ferrite and dielectric material particles is used, the sintered substance preferably contains reaction phases between ferrite particles or between a ferrite particle and a particle of the dielectric material. Such reaction phases will enlarge the dielectric loss.

The percentages of dielectric particles and ferrite particles are chosen such that the dielectric loss will be larger than that of simple substances or a simple mixture of two or more substances. The size of the ferrite particles is chosen such that the sintered substance has a sufficient density to achieve satisfactory magnetic coupling between ferrite particles. The size of the dielectric particles is chosen such that particles of the dielectric material will maintain dielectric properties when mixed with ferrite and yet will not interfere with the magnetic coupling of ferrite particles.

"High permeability" and "high permittivity" refer to permeability of greater than 1 ($\mu'>1$) and permittivity of greater than 20 ($\epsilon'>20$), and preferably $\epsilon'$ is proportional to $\mu'$, where $\epsilon'$ and $\mu'$ denote respectively effective permittivity and effective permeability. "High frequency" refers to a frequency of about 10 MHZ to about 10 GHZ.

The suppressor member can le disposed at any location at which it will effectively reduce the leakage of electromagnetic waves. Preferably, the suppressor member is disposed within the casing.

The apparatus is particularly useful for shielding electromagnetic radiation which otherwise would be emitted from an electronic device or would enter a device, causing interference.

It is desirable to position the suppressor member at a location close to a place at which electromagnetic waves are not sufficiently shielded. For example, the suppressor member may be positioned close to a circuit which is prone to be influenced by electromagnetic waves, or near a circuit which is likely to generate electromagnetic waves which might interfere with other devices.

The following expressions hold when complex permeability and complex permittivity are denoted respectively as $\mu$ and $\epsilon$, effective permeability and effective permittivity are denoted by $\mu'$ and $\epsilon'$, respectively, and the magnetic loss and dielectric loss are denoted respectively as $\mu''$ (imaginary part of $\mu$) and $\epsilon''$ (imaginary part of $\epsilon$).

$$\mu=\mu'-j\mu''$$

$$\epsilon=\epsilon'-j\epsilon''$$

where $j=(-1)^{\frac{1}{2}}$.

Based upon the above phenomena and formulas, if a member having high permeability and a member having high permittivity are suitably arranged inside an electronic device having a casing made mainly of electromagnetic shielding material which has some type of opening, at least some of the electromagnetic waves which would otherwise leak from the opening could be sealed within the casing and absorbed by the suppressor member, thereby remarkably reducing the electromagnetic interference which would otherwise be caused by the device.

When a suppressor member has high permeability as well as high permittivity, the location of the suppressor member within the casing is not critical.

When a suppressor member is provided near an opening or a less shielded portion of the device, for example, a display screen, the ratio of electromagnetic waves which leak is decreased.

When such suppressor member is provided close to a circuit which is prone to the influence of electromagnetic waves, or close to a circuit which is likely to generate electromagnetic waves which may interfere with other devices, the suppressor can suppress electromagnetic interference independently of the casing.

As this invention can reduce the level of electromagnetic waves leaking from ar electronic device, by, for example, at least 3 dB or more, it can be remarkably effective as a reductive or preventive measure against electromagnetic interference.

DETAILED DESCRIPTION OF THE INVENTION

The invention is described in detail below with reference being made to the drawings showing preferred embodiments.

Figure 1:
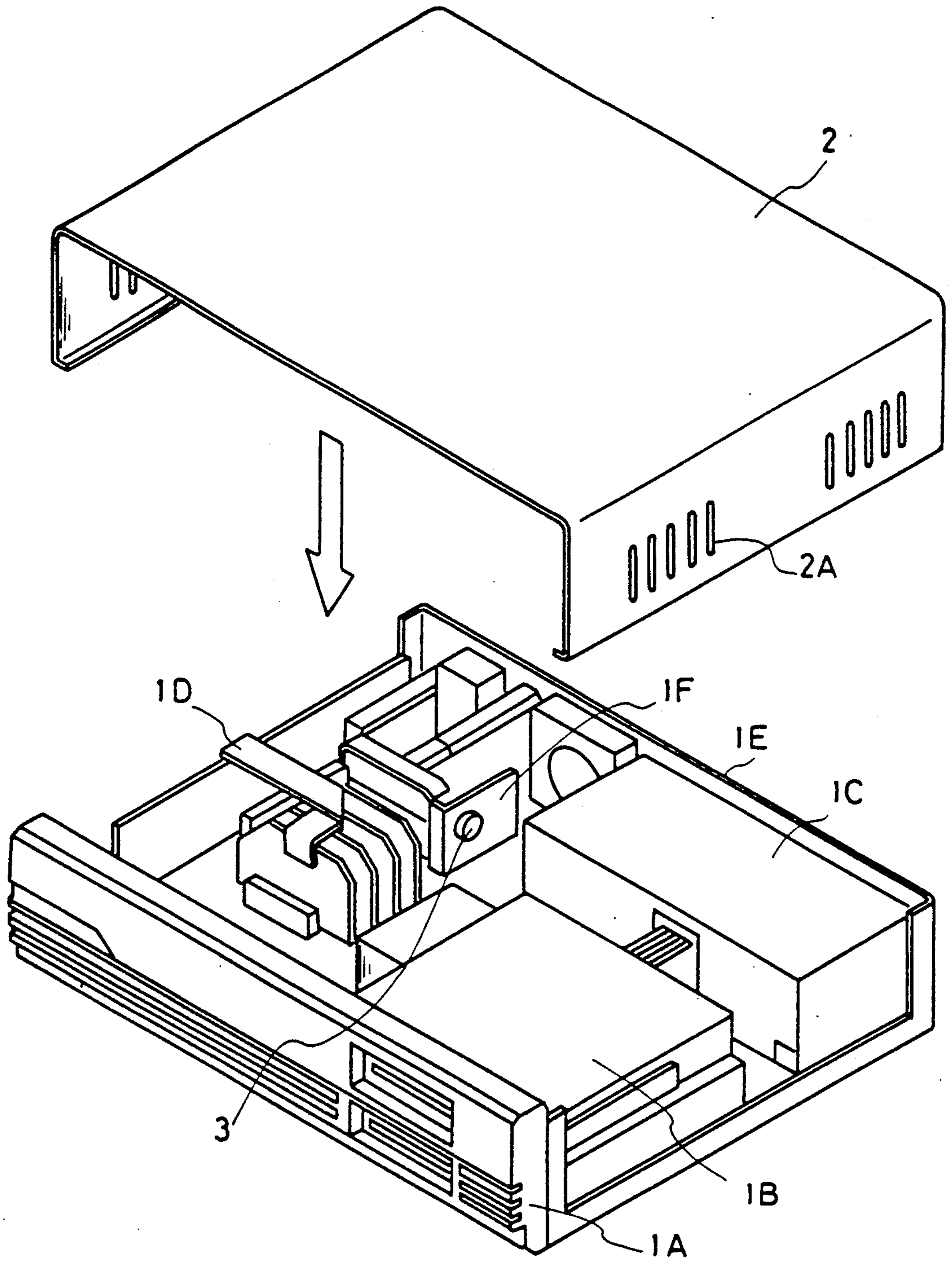
FIG. 1 is an exploded perspective view showing a first embodiment according to this invention.

FIG. 1 is an exploded view showing an embodiment of this invention in which the electronic device containing the shielding apparatus is a personal computer. In the figure, the frontal section 1A of a body 1 of the personal computer is molded with plastic and is provided with a shielding member on the internal surface of the plastic. A disc unit IB and a power source 1C are covered on every face with metal plates. Printed circuit board 1D is not shielded with metal plates. A metal plate 1E is erected on the rear side of body 1, and metal plate (not shown) is attached to all four sides of the computer terminal to form the bottom of the device. A metal casing 2 which has heat radiating openings or holes 2A is placed on the body 1 from above, forming the top and two opposite sides of the terminal. A metal plate (not shown) is inserted on the plastic molding on the frontal section 1A covering the inside except for the inlet port for said disc unit 1B. The casing 2, the back metal plate 1E, the metal plates at the bottom (not shown) and the on the frontal side 1A are made of conventional electromagnetic shielding material. The metal plates on the front and back sides and on the bottom form part of the casing, so that the casing is made almost completely from electromagnetic shielding material.

The reference numeral 1F denotes a partition plate provided between the printed circuit board 1D and the power source 1C.

This invention is characterized in that an electromagnetic suppressor member 3 made primarily from a material having high permeability and/or high permittivity at high frequencies as well as having electromagnetic loss is provided on the partition plate 1F inside the casing.

The electromagnetic suppressor member 3 has at least either high permeability or high permittivity and shows a large magnetic loss and/or large dielectric loss. The volume of the member is ca. 10% or less of the volume inside the casing. The suppressor member of the first embodiment has a cylindrical shape, however, other shapes may also be used.

In the preferred embodiment, the suppressor member 3 is made of particles of a magnetic substance mainly comprising ferrite which is generally expressed as $MOFe_2O_3$ (wherein M denotes a metal, preferably including at least one of Mn, Ni, Mg, Co, Cu, Fe and Zn), for example $(Ni_{0.3}Zn_{0.7})OFe_2O_3$, and/or a ferroelectric substance having a perovskite structure, expressed as $ABO_3$, where A and B denote metals. Preferably, A includes at least one of alkaline earth metals, Pb, Na, K, Ag or W and is most preferably Ba Sr, Pb or Ca. B preferably includes at least one of Ti, Zr, Zn, Mg, Nb, Fe, Co, Ni, Cr, W, Ta, Mn and Bi. The proportion of groups A and B is sufficient to combine with the unsatisfied valencies of $—O_3$, and the proportion of group M is sufficient to combine with the unsatisfied valencies of the group $—Fe_2O_3$. In a single compound, M may be one or more types of metals. The ferroelectric substance preferably has both high permeability and high permittivity. Suitable materials for the suppressor member are described in further detail in co-pending application Ser. No. 07/353,803 filed in the U.S. Patent Office on the same date as this application. The contents of this co-pending application are incorporated by reference.

An example of the most preferred suppressor member and a method for its use will now be described.

Starting materials of $BaCO_3$ and $TiO_2$ having particles sizes of about a few μm, respectively are mixed in a mole ratio of about 1:1 and calcined at a temperature of about 1400° C. for about 4 hours in air, and the $BaTiO_3$ which is obtained is pulverized to obtain a powder of BaTiO3 having a particle size of about 0.5 μm. Starting materials of $NiCO_3$, $Fe_2O$ and ZnO were mixed in a mole ratio 3:7:10, and the resulting mixture is calcined at 1000° C. for 4 hours in air, pulverized and granulated to obtain calcined ferrite powder having a particle size of about 200 μm. The calcined ferrite powder is then mixed with the $BaTiO_3$ in a suitable amount, as a non-limiting example, in a 1:1 mole ratio, molded and sintered at 1250° C. for 10 hours in air. The resulting suppressor member is then placed on the partition plate IF inside the casing.

Figure 2:
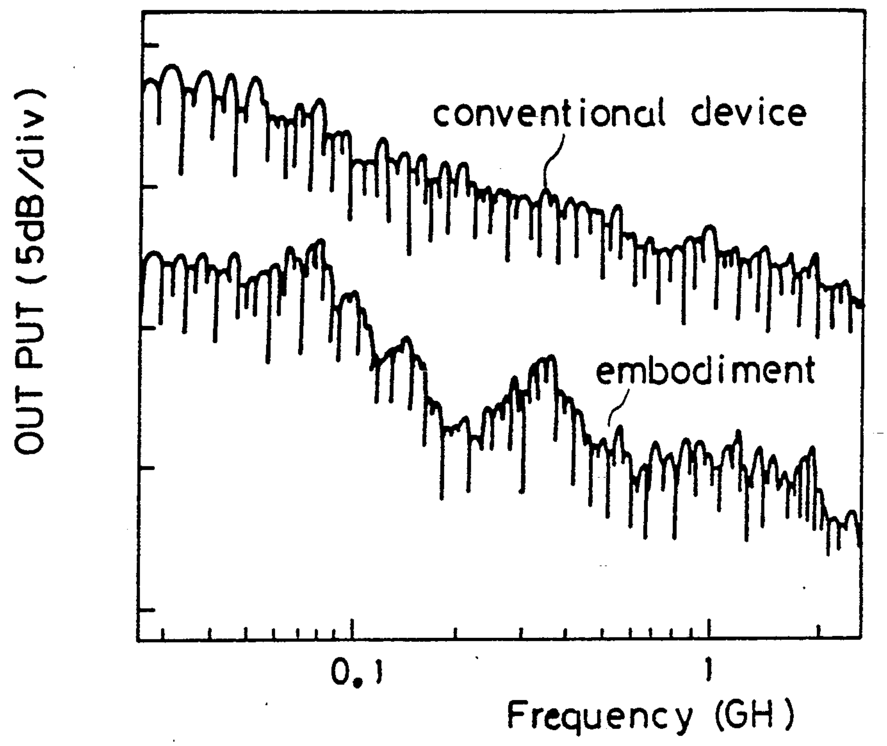
FIG. 2 is a graph showing the change in decibel level when a first sample of the suppressor member is used in a personal computer.

FIG. 2 shows the relative amounts of electromagnetic waves leaking from a personal computer (PC 8801 produced by NEC) wherein a first sample of the electromagnetic suppressor member 3 is included. Data is also shown for leakage when a suppressor member is not included. The sample had a cylindrical shape and was made of $(Ni_{0.3}Zn_{0.7})OFe_2O_3$, and its volume was 1% of the inner volume of the personal computer. The graph shows that leakage of electromagnetic waves was reduced by ca. 5 dB compared with a conventional device, except in certain frequency bands. Because the electric field component is large, the level of reduction is smaller in some frequency bands than in others. The characteristics may vary slightly depending upon the location of the suppressor member, due to the effect of the distribution of electromagnetic fields.

Figure 3:
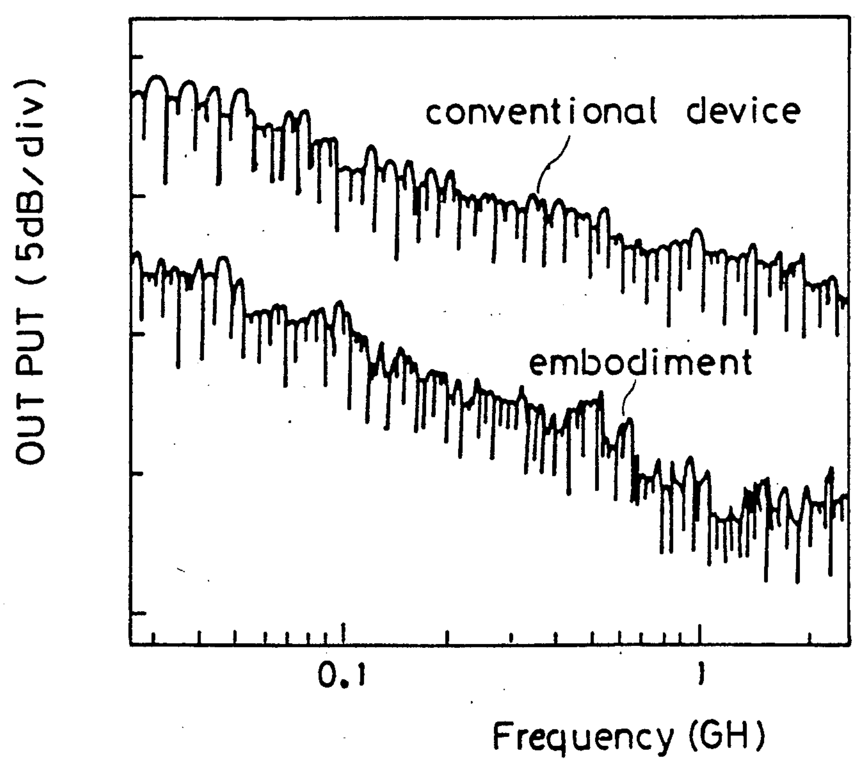
FIG. 3 is a graph showing the change in decibel level wherein a second sample of the suppressor member is used in the personal computer.

FIG. 3 shows the results for leaked electromagnetic waves from the personal computer using a second sample as the suppressor member 3. The method of suppressing waves was similar to that used for the first sample. The second sample was a mixed material of $(Ni_{0.3}Zn_{0.7})OFe_2O_3$ and $BaTiO_3$ in a mole ratio of 1:1 which had high values of both permittivity and permeability. It is shown by this graph that leakage of electromagnetic waves could be reduced by ca. 5 dB in all the frequency bands. When the position of the electromagnetic wave suppressor member was changed, similar results were obtained.

Based upon the above results, it is preferable that when a shielding material has high permittivity, the suppressor member preferably is positioned inside the casing at a location where the electric field is large. When the material has high permeability, it preferably is positioned at a location where the magnetic field is large. When the material has both high permittivity and high permeability, it may be positioned at any location.

As to the volume ratio between the casing and the suppressor member, it is preferable to determine a suitable ratio depending on the loss factor of the material and the desired level of reduction in the leaking of electromagnetic waves.

Figure 4:
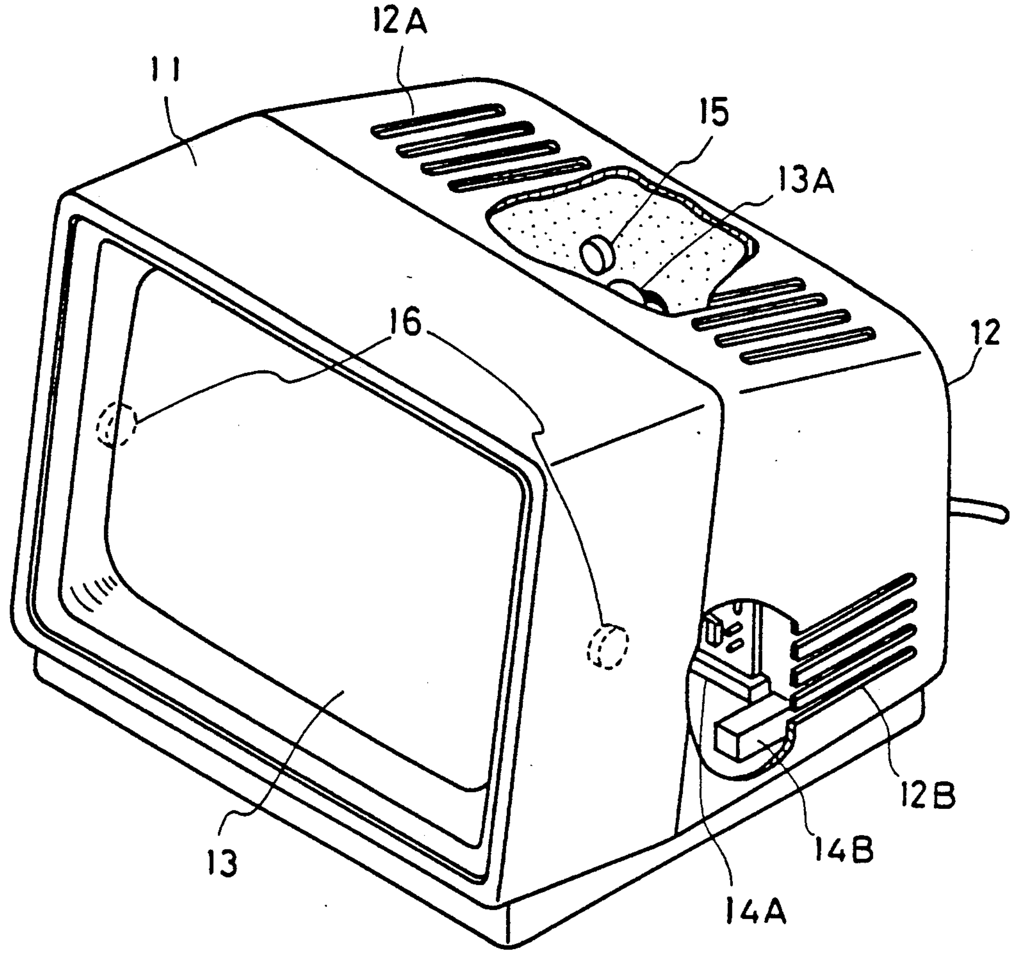
FIG. 4 is an perspective view showing a second embodiment according to this invention.

FIG. 4 shows a second embodiment of this invention wherein the electronic device is a display comprising front casing 11 and rear casing 12 made of plastic moldings which are internally packaged with cathode-ray tube 13 and related parts 14A and 14B. The internal surfaces of the front and rear casings 11 and 12 are coated with electroconductive paint and treated for electromagnetic shielding using conventional techniques. The device has heat radiating holes 12A and 12B and opening 17 (unshielded portion) at the front of CRT 13. The major source of electromagnetic waves is an electron gun 13A of CRT 13.

Electromagnetic interference can be remarkably reduced by providing an electromagnetic wave suppressor member 15 having high permittivity close to the electron gun 13A and by providing electromagnetic wave suppressor members 16 having high permeability as shown with broken lines inside the front casing 11.

It is to be understood that the embodiments shown are included to aid in describing the invention, but are not intended to limit the scope thereof.

We claim:

1. An apparatus for shielding electromagnetic radiation comprising:
   - a casing comprised of electromagnetic wave shielding material;
   - an electromagnetic wave suppressor member interior of the casing comprised of a material having at least one of high permeability and high permittivity at a high frequency and having electromagnetic loss; and
   - a circuit having said suppressor member positioned proximate thereto.

2. The apparatus of claim 1 wherein said suppressor member has both high permeability and high permittivity.

3. The apparatus of claim 1 wherein said suppressor member is positioned proximate a location at which electromagnetic waves are not sufficiently shielded by said casing.

4. The apparatus of claim 1 wherein said electromagnetic loss comprises at least one of magnetic loss and dielectric loss.

5. The apparatus of claim 1 wherein said suppressor member is comprised of particles of at least one of
   - ferrite, expressed by the chemical formula $MOFe_2O_3$, where M comprises a metal, and
   - a dielectric material, which has a perovskite structure and is expressed by the chemical formula $ABO_3$, where A and B are metals.

6. An electronic device having a casing comprising:
   - electromagnetic wave shielding member;
   - an electromagnetic wave suppressor member interior the shielding member comprised of a material having at least one of high permeability and high permittivity at a high frequency and having electromagnetic loss; and
   - a circuit having said suppressor member positioned proximate thereto.

7. The device of claim 6 wherein said suppressor member has both high permeability and high permittivity.

8. The device of claim 6 wherein said suppressor member is positioned proximate a location at which electromagnetic waves are not sufficiently shielded by said casing.

9. The apparatus of claim 6 wherein said electromagnetic loss comprises at least one of magnetic loss and dielectric loss.

10. The device of claim 6 wherein said suppressor member is comprised of particles of at least one of
    - ferrite, expressed by the chemical formula $MOFe_2O_3$, where M comprises a metal, and
    - a dielectric material, which has a perovskite structure and is expressed by the chemical formula $ABO_3$, where A and B are metals.

* * * * *